United States Patent [19]

Klinke et al.

[11] Patent Number: 5,404,282
[45] Date of Patent: Apr. 4, 1995

[54] MULTIPLE LIGHT EMITTING DIODE MODULE

[75] Inventors: Richard J. Klinke, Sunnyvale; James L. Leising, Redwood City; Gary D. Sasser, San Jose, all of Calif.

[73] Assignee: Hewlett-Packard Company, Palo Alto, Calif.

[21] Appl. No.: 293,110

[22] Filed: Aug. 19, 1994

Related U.S. Application Data

[63] Continuation of Ser. No. 123,134, Sep. 17, 1993, abandoned.

[51] Int. Cl.⁶ .............................................. H01R 4/18
[52] U.S. Cl. .................................. 362/249; 362/252; 362/800; 439/877
[58] Field of Search .................. 362/249, 252, 800; 439/877, 879, 885; 361/637, 639, 698; 174/703, 172, 52.4

[56] References Cited

U.S. PATENT DOCUMENTS

| | | | |
|---|---|---|---|
| 4,329,625 | 5/1982 | Nishizawa et al. | 362/800 |
| 5,010,463 | 4/1991 | Ross | 362/800 |
| 5,155,669 | 10/1992 | Yamuro | 362/800 |
| 5,260,549 | 11/1993 | Garritano | 439/877 |
| 5,268,828 | 12/1993 | Miura | 362/249 |

OTHER PUBLICATIONS

Tech-Line Engineering Company Catalog, "Clinching A New Technology", 4 pages.
BTM Corporation Catalog, "The Simple Solution", 14 pages.

Primary Examiner—Ira S. Lazarus
Assistant Examiner—Sara Sachie Raab

[57] ABSTRACT

A LED module for providing a source of illumination comprises a plurality of LED lamps each having an anode lead and a cathode lead for providing electrical and mechanical connection. The anode lead of each LED lamp is connected to an anode bus bar and the cathode lead of each LED lamp is connected to a cathode bus bar by solderless connection. The bus bars and the leads of each LED lamp may be integral with each other. Alternatively, the bus bars and leads may be non-integral with each other, connected by an interlocking interaction or interference fit between approximately complementary portions of each lead and bus bar. The LED module may accommodate serial electrical interconnection with other LED modules, it may be shaped according to the particular contour or design of an accommodating light assembly, and it may comprise LED lamps placed at arbitrary positions to achieve a predetermined degree of illumination.

5 Claims, 5 Drawing Sheets

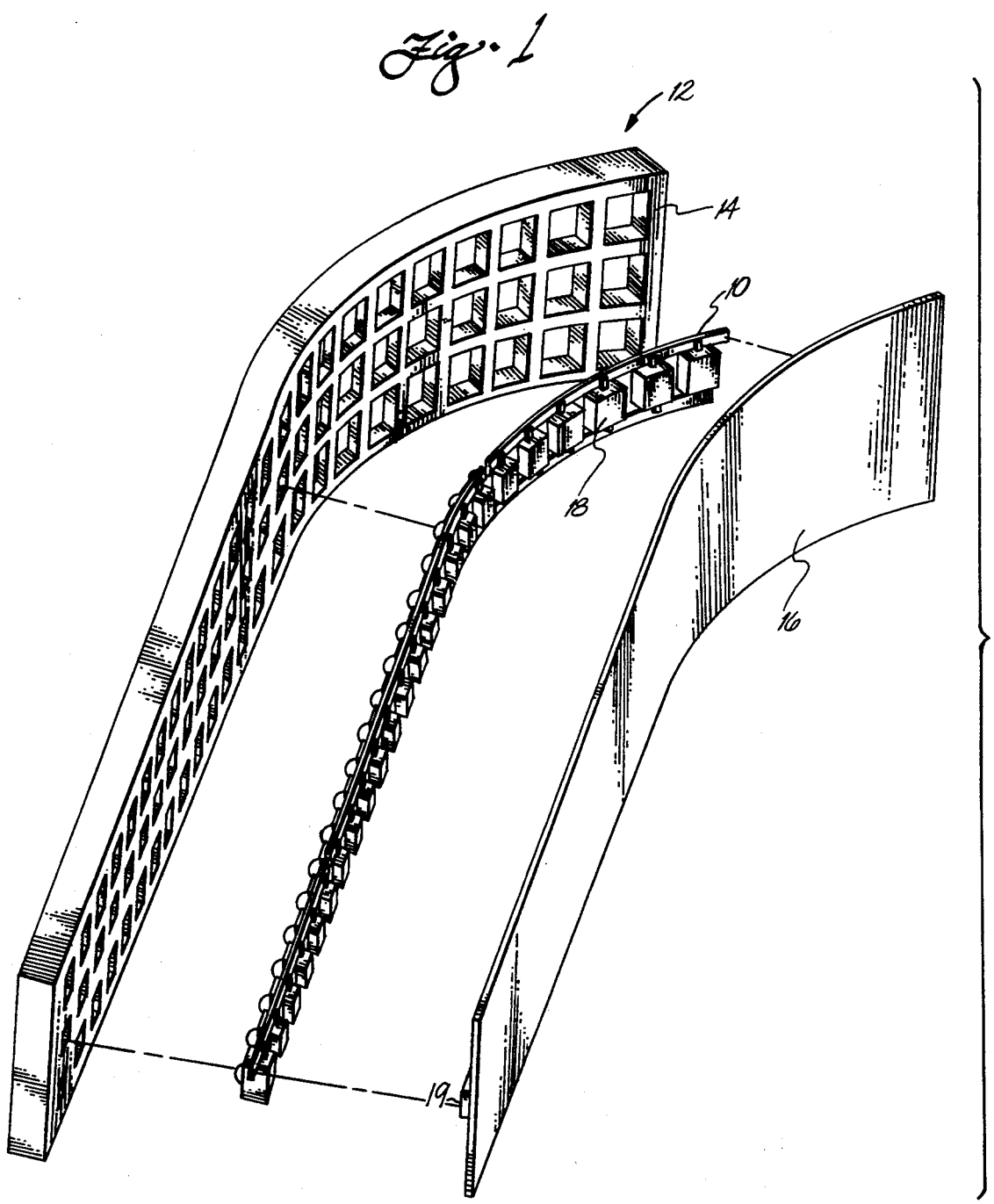

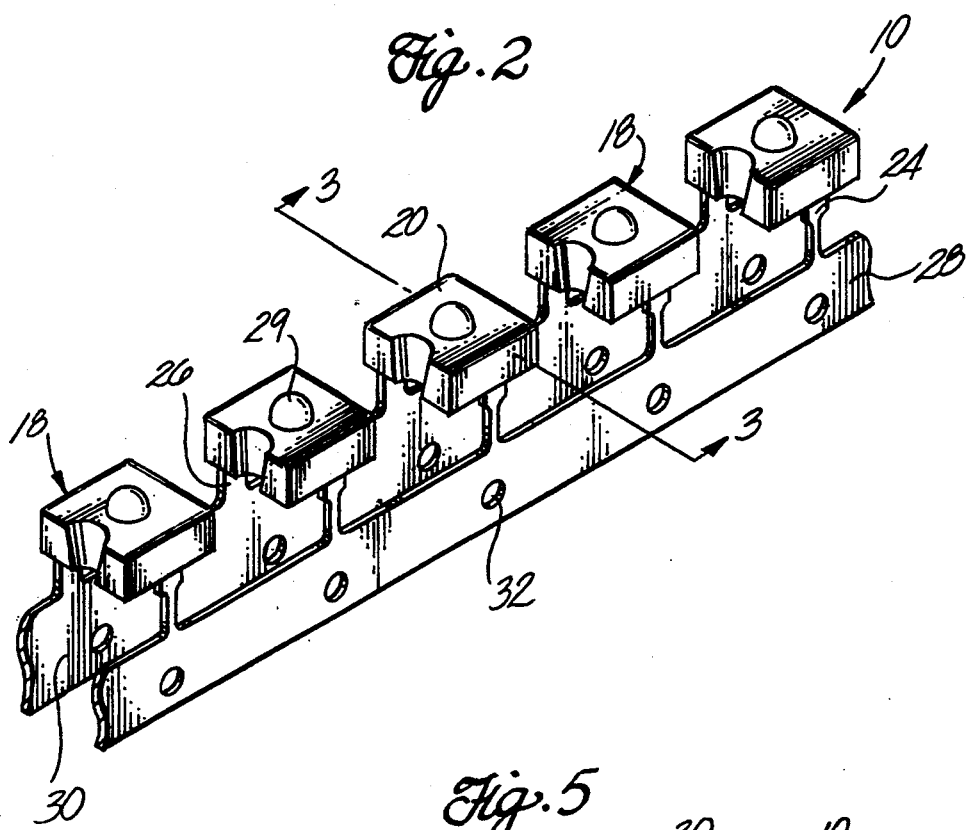
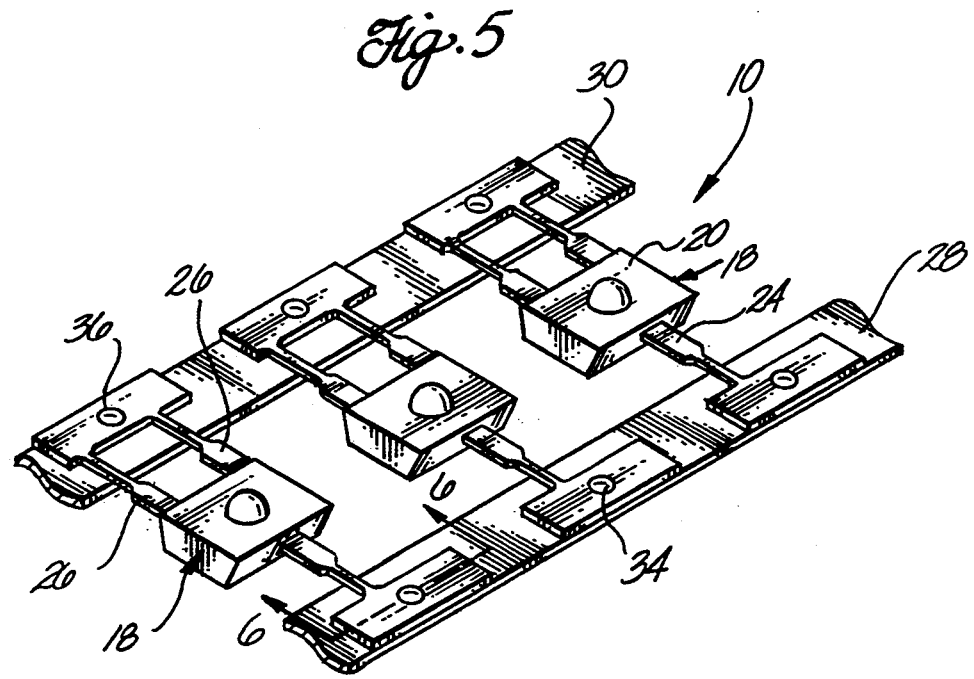
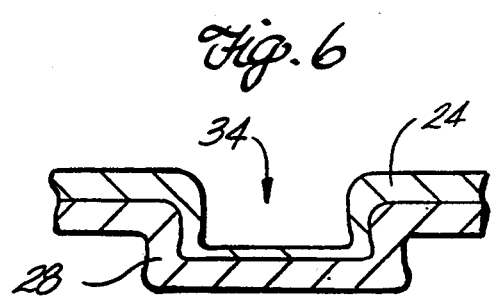

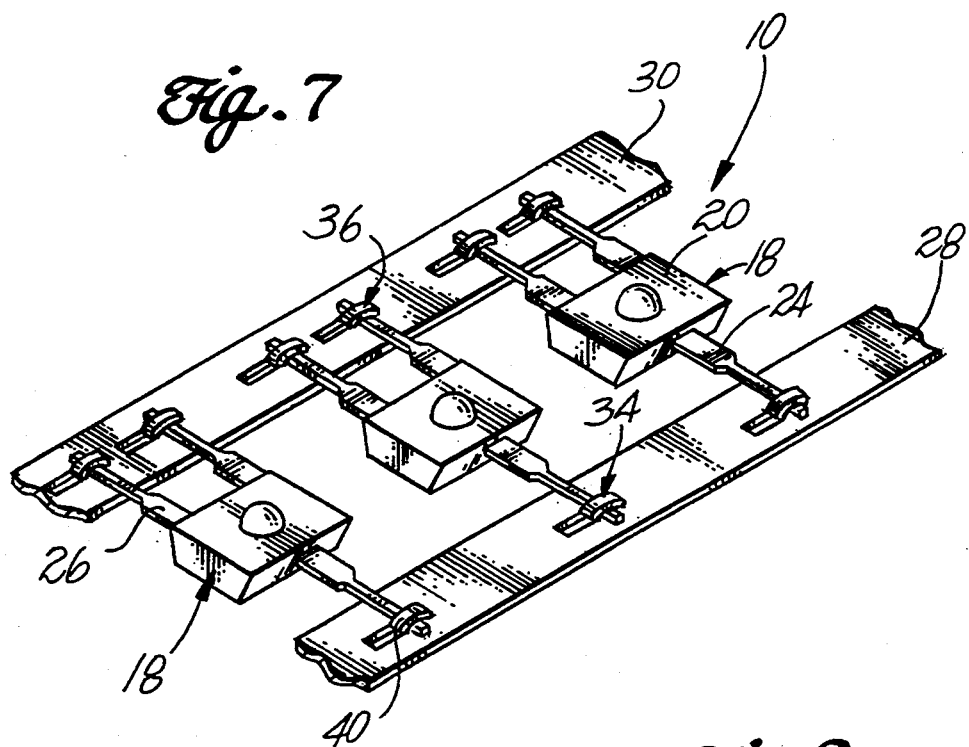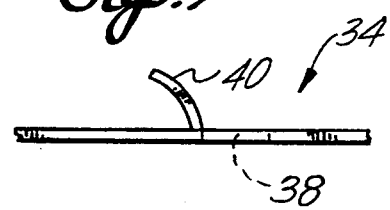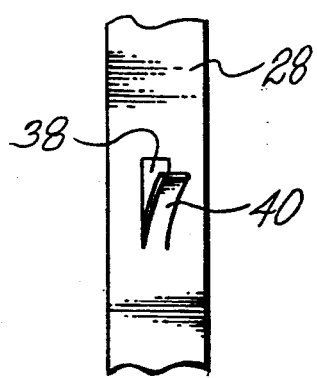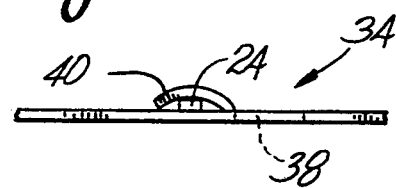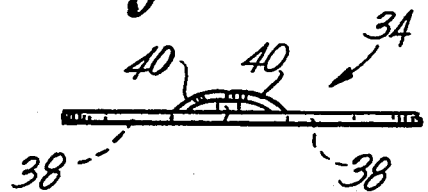

MULTIPLE LIGHT EMITTING DIODE MODULE

CROSS REFERENCE TO RELATED APPLICATIONS

This is a continuation of application Ser. No. 08/123,134, filed on Sep. 17, 1993, now abandoned.

FIELD OF THE INVENTION

This invention relates to a device comprising a multiplicity of light emitting diodes for providing a source of illumination such as for the exterior portion of an automobile.

BACKGROUND

Light emitting diodes (LEDs) are a type of semiconductor device that emit a visible light when biased in the forward direction. Lamps incorporating such LEDs as their light source are referred to as LED lamps. Due to their construction, LED lamps are typically smaller than standard bulb or filament type lamps, making their use particularly desirable in applications where a premium is placed on space, such as cameras, watches, computers, computer printers and numerous other compact devices. Additionally, the LED is energy efficient in that it only requires a small amount of electricity in order to generate a relatively strong light. Therefore, the LED is a particularly desirable lighting source in applications where energy efficiency is important, such as with battery powered portable devices.

Generally speaking, although LED lamps offer a relatively high degree of illumination for their size, LED lamps must usually be combined with other LED lamps in order to achieve the same degree of illumination as a light assembly illuminated by standard bulb type lamps. However, the combination of LED lamps typically occupy less space and require less energy to operate than that of the standard bulb type lamps they replace. The space saving and energy efficient features of the LED make it a popular choice with designers and manufacturers who are motivated to reduce the size and/or increase the efficiency of the light source used in their products.

Recently, LED lamps have found application in the automobile industry as a source of illumination, replacing standard bulb type lamps, for exterior lights, such as parking lights, brake lights and the like. It is highly desirable that the light source used in the automobile be energy efficient. The LED is a popular choice in such an application because its use permits the replacement of standard bulb type lamps that require a larger space and consume a greater amount of energy to operate. The space savings that results from replacing standard bulb type lamps with the LED in such an application may be better put to use in the form of added passenger or storage capacity. Size savings can translate into weight savings as well, an important factor in fuel economy.

The standard bulb type lamps are known to have a high rate of failure when used in an automotive application. The high failure rate is attributable to the filament breaking due to sudden shocks or bumps experienced under normal driving conditions. Unlike standard bulb type lamps, LED lamps are immune to such failures due to their inherent construction. The light emitted by an LED is caused by the generation of photons from materials within the LED and is not the product of an electrical current passing through an illuminating filament. Since the LED does not rely on the fragile filament scheme used in bulb type lamps it is better suited for use as a reliable automobile lighting source.

Additionally, standard bulb type lamps are known to generate a large amount of heat during their operation. The heat generated by standard bulb type lamps not only shortens the life of the light source but may cause thermal damage, deformation, cracking or the like to other nearby lighting elements, such as the deformation or cracking of a nearby plastic lens and the like.

Accordingly, the choice of using LED lamps to replace standard bulb type lamps as the lighting source for the automobile is desirable because their use provides a more efficient use of space, is energy efficient, eliminates a common cause of light source failure, and eliminates lens deformation associated with a high heat generating bulb type light source.

A single LED typically produces less illumination than that of a standard bulb type light. Therefore, a plurality of LED lamps are combined in order to provide the same degree of illumination provided by one or more standard bulb lamps. The LED lamps are combined to form a LED module that comprises a plurality of LED lamps and means for mechanically and electrically connecting the LED lamps to a light assembly. The LED module may be configured so that it contains the required number of LED lamps arranged in a circuit to provide the desired degree of illumination. Additionally, the LED module should be configured to accommodate the particular shape or size of the light assembly, which may be defined by the shape or contour of the automobile body design.

LED modules comprising a plurality of LED lamps are known in the art. Such modules are generally made up of a plurality of LED lamps, each having an anode and cathode lead, and a printed circuit board with conductive paths. The plurality of LED lamps are each connected to the printed circuit board by soldering the anode lead of each LED to one path and soldering the cathode lead of each LED to another path. The LED lamps may be arranged along the printed circuit board as desired in order to meet the illumination, space, and configuration requirements of the particular light assembly. The LED module is mechanically attached to the light assembly and the printed circuit board is electrically connected to an anode or cathode electrical source within the light assembly.

Such LED modules typically use a solder connection to connect the anode and cathode lead of each LED to the respective conductive paths in order to ensure a good electrical and mechanical connection. However, solder connecting each LED is a known cause of LED failure. During the soldering operation heat is transferred from the soldering site, through the lead of each LED and to the LED chip resulting in thermal damage. This potential for thermal damage during the manufacture of the LED module may reduce the reliability of the LED and limits its viability as a desirable lighting source.

LED modules known in the art have attempted to minimize the potential for thermal damage to the LED lamps by constructing the LED leads from materials having a low thermal conductivity, such as steel. Using materials of low thermal conductivity reduces the amount of heat that can be transferred from the solder site to the LED chip itself. However, materials having low thermal conductivity necessarily have a correspondingly low electrical conductivity. Therefore, the methods used in the art to minimize the thermal damage of the LED lamps during the soldering operation has resulted in the construction of a LED module that does not display optimal electrical efficiency. Additionally, LED leads constructed from such low thermal conductivity materials effectively limit the amount of power that the LED can dissipate and remain within reliable operational parameters.

Mounting LED lamps on a printed circuit board is also costly. Each LED must be individually positioned on the board for assembly. The boards themselves are costly. Accordingly, a different approach for connecting LED lamps is desirable for both reducing the cost of an LED module and increasing the electrical efficiency of an LED module.

It is, therefore, desirable to have an LED module that can accommodate a plurality of LED lamps in a manner that will optimize the reliability of each LED. It is desirable that mounting of LED lamps in the LED module promotes optimal electrical and thermal efficiency. It is desirable that the LED module permits arbitrary spacing of each LED in order to correspond to predetermined shapes or illumination requirements. It is also desirable that the LED module be practical to produce from both an economic and manufacturing standpoint.

BRIEF SUMMARY OF THE INVENTION

There is, therefore, provided in practice of this invention an LED module used as a source of illumination. The LED module comprises a plurality of LED lamps each having an anode lead and a cathode lead. The anode lead of each LED is connected to an anode bus bar and the cathode lead of each LED is connected to a cathode bus bar. The anode and cathode bus bars may be arranged in parallel relation to each other, and separated by the plurality of LED lamps. The anode and cathode bus bars are constructed from an electrically and thermally conductive material compatible with the anode lead and cathode lead of each LED. The LED module may be configured having LED lamps arranged in a serial configuration or a combination serial/parallel configuration depending on the predetermined lighting requirement and/or the design of the accommodating light assembly.

The anode lead and cathode lead of each LED may be connected to the respective anode and cathode bus bars by any of several techniques. The bus bars and leads of each LED lamp may be integral with each other. Alternatively, the bus bars and leads of each LED lamp may be independent members that are connected by an interference fit formed between approximately complementary portions of each lead and bus bar. For example, each lead and bus bar may be attached by an interlocking fit formed between a recessed portion of the lead and an approximately complementary recessed portion of the bus bar. Each lead and bus bar may also be attached by an interference fit formed between the lead and an accommodating tab integral with the bus bar. Alternatively, each LED lead and bus bar may be attached by using a low-heat technique such as spot welding or the like.

The LED module is configured to accommodate series and parallel electrical and mechanical interconnection with other LED modules to form a LED assembly having a predetermined length and comprising a desired number of LED lamps.

The LED module according to the present invention permits a designer to vary the placement of each LED in the module depending on the desired lighting requirement for a particular application. The LED module may also be configured to fit within a particularly shaped light assembly. The integral, interlocking, interference, or low-heat connection of each LED within the LED module avoids the need to solder connect each LED, eliminating potential thermal damage to each LED, and thus increasing the reliability of the LED module. Additionally, such a connection scheme avoids the costs associated with having to mount the LED lamps on a printed circuit board.

BRIEF DESCRIPTION OF THE DRAWINGS

These and other features and advantages of the present invention will become appreciated as the same becomes better understood with reference to the specification, claims, and drawings wherein:

FIG. 1 is a semi-schematic exploded side view of an automobile light assembly comprising the LED module of the present invention;

FIG. 2 is a perspective view of a first embodiment of the LED module according to the present invention;

FIG. 5 is a perspective view of a second embodiment of the LED module;

FIG. 6 is a fragmentary cross sectional view of a lead connection known as a button lock taken at 6—6 in FIG. 5;

FIG. 7 is a perspective view of a third embodiment of the LED module;

FIG. 8 is a plan view of an anode bus bar after a tab slot is formed;

FIG. 9 is a side view of the anode bus bar after an integral tab has been bent away from the surface of the anode bus bar;

FIG. 10 is a side view of the anode bus bar after the integral tab has been bent about the anode lead;

FIG. 11 is a side view of an anode bus bar comprising two integral tabs;

DETAILED DESCRIPTION

Figure 3:
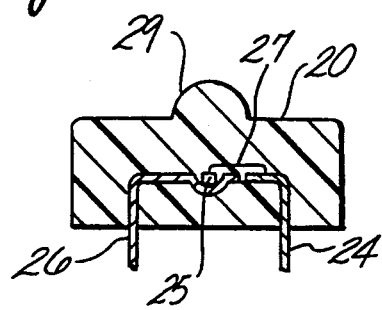
FIG. 3 is a cross sectional view of a LED taken at 3—3 in FIG. 2.

FIG. 1 shows a light emitting diode (LED) module 10 according to the present invention as it may be used to provide exterior lighting in an automobile light assembly 12 such as a brake light. The automobile light assembly comprises a housing 14, one or more LED modules 10, and a backplate 16. The LED module comprises a plurality of LED lamps 18 that are electrically and mechanically connected in a manner forming a strip of LED lamps. The LED module is sized and configured to accommodate mechanical and electrical connection with the back plate 16 that may be shaped according to the contour or design of the automobile body. The LED module is made up of the desired number of LED lamps to accommodate the light housing 14 and provide the desired amount of illumination. The LED module is incorporated between the back housing and the light housing to form the automobile light assembly. The LED module may be electrically connected at each end to an electrical connector 19 extending from the backplate.

Although the LED module of the present invention is described in the context of providing illumination for the exterior portion of automobiles, the LED module of the present invention may also be used as a light source for illuminating the interior portion of an automobile or as a light source in applications other than automobiles.

FIG. 2 shows a first embodiment of the LED module 10 according to the present invention. The LED module comprises a plurality of LED lamps 18 (although the LED module may comprise any number of LED lamps, for purposes of clarity a LED module comprising only five LED lamps is shown). Each LED lamp has a front face 20 and a back face positioned opposite the front face. The front face of the LED lamp is the face from which the LED in the lamp emits light. Each LED lamp has an anode lead 24 and a cathode lead 26 that each extend downward and away from opposite ends of the back face and provide electrical connection to the LED in the lamp.

Each LED lamp is conventional. It comprises an anode lead 24 and a cathode lead(s) 26 for making electrical connection to a light emitting diode 25 as shown in FIG. 3. Generally, the LED is secured in a reflective cavity in, for example, the cathode lead by an electrically conductive adhesive. A fine wire 27 is wire bonded to the front face of the LED and to the adjacent anode lead. The ends of the leads and the LED are embedded or "potted" in a transparent plastic such as an epoxy resin. Since the leads are secured in the plastic, they also serve as mechanical support for the LED lamp. Quite often the front face 20 of the LED lamp is molded with a convex lens 29 for concentrating the emitted light. In this description, the terms LED and LED lamp may be used interchangeably.

The specific construction of the LED and LED lamp, the arrangement of leads in the lamp, etc., are not significant for practice of this invention. This can be recognized, for example, by noting that the leads in the embodiment of FIG. 2 exit the plastic through the back face, whereas the leads in the embodiment of FIG. 5 exit through side faces of the plastic. It will also be recognized that some LED lamps are round domes instead of rectangular bodies with a domed lens on a flat face.

Each LED lamp is connected to an anode bus bar 28 and a cathode bus bar 30. In the first embodiment, the anode lead of each LED lamp is integral with the anode bus bar. Similarly, the cathode lead of each LED lamp is integral with the cathode bus bar.

The position of each bus bar relative to each LED lamp may be dependent on the particular mechanical and/or electrical connection requirement of an accommodating light assembly. In the first embodiment, the anode bus bar is positioned adjacent to the back face of each LED lamp near the anode lead 24. In similar fashion, the cathode bus bar is positioned adjacent to the back face of each LED lamp near the cathode lead 26. The anode bus bar and cathode bus bar each comprise a strip of electrically conductive material. The configuration and thickness of each bus bar may be dependent on the number of LED lamps desired for a particular application as well as the particular electrical or mechanical connection requirements of a particular light assembly. A typical LED module may comprise an anode and cathode bus bar which are each approximately five millimeters high, approximately 0.4 millimeters thick, and are spaced apart from each other a distance of approximately five millimeters. The LED lamps are arranged on the module at spacings of about ten millimeters.

In FIGS. 2, 5, and 7 the LED module is illustrated having an anode bus bar 28 connected to the anode lead 24 of each LED lamp, and similarly a cathode bus bar 30 is connected to the cathode lead 26 of each LED lamp. The manner in which the LED lamp leads are configured is not intended be representative of a particular LED lamp. For example, each LED lamp in FIG. 5 is shown with two cathode leads and only one anode lead. The differences between the two leads are not meant to be representative of a particular type of LED lamp, but rather, are used for purposes of clarity to distinguish the two leads. It is to be understood that there is no conventional anode or cathode lead configuration. Accordingly, any type of LED lamp may be used to construct an LED module according to practice of this invention.

In the first embodiment, the anode bus bar and cathode bus bar and the respective anode lead and cathode lead of each LED lamp are integral with each other. The integral lead-bus bar arrangement may be accomplished during the manufacturing process of the LED lamps. The LED lamp is constructed in such a manner that the anode bus bar and cathode bus bar are incorporated as the anode and cathode portion of each LED lamp. This type of bus bar may be referred to as a "free" or "low cost" bus bar because it is the product of the method used to manufacture the LED lamps and is not manufactured as an individual component. Accordingly, the LED module comprising such an integral lead-bus bar connection arrangement should be more cost efficient to produce than LED modules comprising bus bars that are non-integral members of each LED lamp.

The integral lead-bus bar connection of the first embodiment avoids the need to use a solder connection to connect each LED lamp to the bus bars. Avoiding the need to solder connect each lead to its respective bus bar eliminates potential thermal damage that may occur to each LED lamp, and thus increases the reliability of each LED lamp and the LED module. Additionally, eliminating the need to solder connect each LED lamp also permits the use of bus bars made from materials having a high electrical and thermal conductivity, optimizing the electrical and thermal efficiency of the LED module. A preferred bus bar material may comprise copper and the like.

Since the bus bars of the LED module in this first embodiment are integral members of each LED lamp, the danger of thermal stresses developing between two materials having different thermal expansion coefficients is eliminated. Eliminating the potential for thermal stress to develop between each LED lamp and the bus bars increases the reliability of their mechanical and electrical connection, and thus optimizes the reliability of the LED module.

The LED module according to present invention may be configured to accommodate a plurality of LED lamps used for providing exterior automobile illumination, such as parking lights, tail lights, brake lights and the like. The LED module may be configured as a strip of desired length comprising a predetermined number of sequentially arranged LED lamps. Each bus bar may contain holes 32 or the like as shown in FIG. 2 to facilitate its connection with an electrical connector within a light assembly. The holes may also be used to facilitate the series interconnection of two or more adjacent LED modules as shown by electrical diagram in FIG. 4 using one of the mechanical connection schemes according to principles of this invention.

Figure 4:
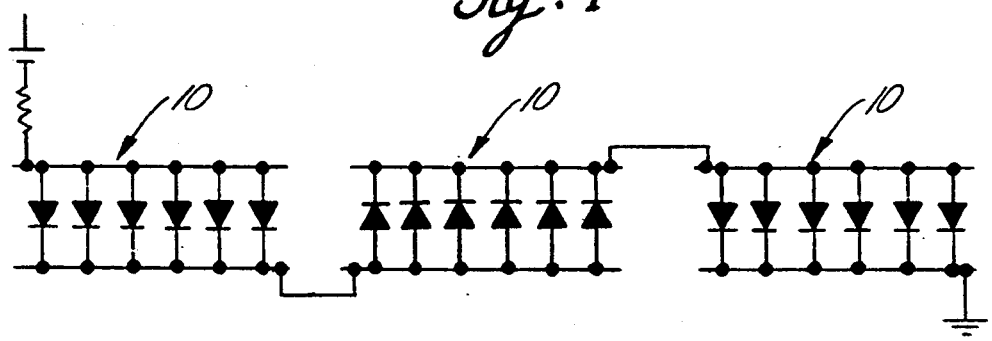
FIG. 4 is an electrical diagram of a LED assembly comprising three LED modules in series electrical connection.

It may be desirable to connect LED modules in an electrical series as illustrated in FIG. 4 to obtain a desired voltage-current relationship for a group of lamps. For example, in an automotive application the voltage available is over 12 volts, whereas the typical voltage drop across an LED is less than about 2 volts. By using groups of lamps in parallel and connecting the groups in series, the desired voltage drop is obtained for a light source with many LED lamps. The number of lamps in a parallel module and the number of such modules connected in series depends on several factors including the area illuminated, the voltage and current available, the reliability of manufacturing the modules, and the number of lamps readily made per module in the specific manufacturing equipment available, for example. For purposes of clarity and illustration, the LED modules may be arranged in an electrical series by electrically connecting the cathode bus bar of each LED module to an anode bus bar of an adjacent LED module.

The ability to interconnect LED modules in series is desirable because it may allow the designer to obtain a desired degree of illumination without being limited by the manufacturing process of the LED lamps. For example, LED lamps may be manufactured in relatively small groups of five or six due to the limitations of the manufacturing process itself. Accordingly, a first embodiment of the LED module comprising LED lamps manufactured by such a process may contain only four to six LED lamps. The designer can overcome the inherent limitations of such a LED lamp manufacturing process, and obtain the desired degree of illumination, by simply interconnecting in series the desired number of LED modules. Each LED module may be connected to an electrical source or with another LED module by techniques well known by those skilled in the art such as by a spot weld, rivet, interference fit and the like.

A shortcoming of the integral lead-bus bar embodiment is a lack of electrical and mechanical flexibility. Different applications of LED lamps call for different spacings between each LED lamp, voltage matching LED lamps, for example, or electrical connections different from the parallel connections illustrated. The tooling for making an integral lead-bus bar embodiment is costly and unless a very large number of modules are to be built, the unit cost may be excessive. Thus, a different technique is desirable for flexibility in the manufacturing process to make LED modules with desired configurations.

Generally speaking, a suitable different technique is to manufacture LED lamps on a bus bar as presently practiced, cut the individual LED lamps from the bus bar, and then reconnect the LED lamps to parallel bar-like strips with any desired spacing. Such modules can be made with a few or many LED lamps in parallel and may be interconnected in series and parallel arrangements to obtain desired electrical properties.

Thus, FIG. 5 shows a second embodiment of the LED module 10 according to the present invention. Like the first embodiment, the second embodiment comprises a plurality of LED lamps 18 (although the LED module may comprise any number of LED lamps, for purposes of clarity a LED module comprising only three LED lamps is shown). Each LED lamp has a front face 20 and a back face positioned opposite to the front face. Each LED lamp has an anode lead 24 and a cathode lead(s) 26 which each extend outwardly and away from the LED lamp from opposite sides and provide electrical connection to the LED lamp. The anode lead of each LED lamp is connected to the anode bus bar 28 and the cathode lead of each LED lamp is connected to the cathode bus bar 30.

The anode bus bar and cathode bus bar are positioned parallel to each other and are separated by the LED lamps. Each bus bar comprises a thin strip of electrically conductive material. The thickness and configuration of each bus bar may vary depending on the desired illumination requirements or configuration of the accommodating light assembly. A preferred LED module may comprise an anode and cathode bus bar that are each approximately five millimeters wide and approximately 0.4 millimeters thick.

The anode and cathode bus bar may be positioned with respect to the LED lamps differently than that illustrated in FIG. 5 depending on the particular configuration or connection requirement of the light assembly. For example, the anode bus bar and cathode bus bar may be positioned with their faces perpendicular to the front face of the LED lamp as shown in FIG. 2. The leads for such a configuration may be bent inside or outside of the plastic potting material.

Unlike the first embodiment, the anode bus bar and cathode bus bar of the second embodiment are non-integral with the respective anode lead and cathode lead of each LED lamp. The anode lead of each LED lamp is connected to the anode bus bar to form an anode lead connection 34. Similarly, the cathode lead of each LED lamp is connected to the cathode bus bar to form a cathode lead connection 36. The leads of each LED lamp may be connected to the bus bars by using an interlocking connection whereby a portion of the lead of each LED lamp is placed in intimate interface with an approximately complementary portion of the respective bus bar. The connection may be formed by using techniques well known to those skilled in the art for other purposes, such as by clinching and the like.

In the second embodiment, the anode lead connection 34 and cathode lead connection 36 each comprises a recessed portion of the lead placed in intimate interface with an approximately complementary portion of the respective bus bar as shown in FIG. 6. The lead connection or button lock in the second embodiment can be formed by a well known commercial process such as one that uses a punch to place an indentation into both the lead and the respective bus bar after the lead had been aligned and placed into position against the surface of the bus bar. In such a technique, a punch deep draws a cup-shaped impression in both the lead and bus bar. When the closed end of the cup is pressed in the opposite direction, the walls of the cups "mushroom" or bulge outwardly a small amount for interlocking the inner cup into the outer cup. This forms both a secure mechanical interlock, but also a low resistance electrical connection. As illustrated, the inner cup is formed in a portion of the lead and the outer cup is formed in the bus bar. These could clearly be reversed if desired.

Although the anode and cathode lead connections of the second embodiment are formed by interlocking recessed lead and bus bar portions, other mechanical interlocking connections defined as an interference fit, interlocking fit or equivalent may be used within the scope of the present invention. For example, an interlocking connection may be achieved by using a rivet and the like as the mushroomed member. Although the second embodiment of LED module shows a single interlocking connection at each lead, the lead may be joined to the respective bus bar by using one or more interlocking connections if such is desired.

Unlike the first embodiment of the LED module, which comprises an anode and cathode bus bar that are integral members of each LED lamp, the second embodiment comprises an anode and cathode bus bar that are non-integral members of each LED lamp. The placement of each LED lamp along the anode and cathode bus bar, therefore, is not dependent on the manufacturing process of each LED lamp. Rather, each LED lamp can be placed at arbitrary positions along the bus bars, permitting the designer to vary the pitch of the LED lamps depending on the particular lighting requirement or configuration of the accommodating light assembly.

The anode and cathode lead connection in this second embodiment, like the first embodiment, avoids the need to solder connect each lead of the LED lamp to the respective bus bars. Avoiding the need to solder eliminates the possibility of causing thermal damage to the LED lamps, and thus increases the reliability of each LED lamp and the LED module. Additionally, avoiding a solder connection permits the use of bus bars constructed from a material having a high electrical conductivity, optimizing the electrical efficiency of each LED lamp and the LED module. Copper is a preferred bus bar material.

To minimize the occurrence of thermal stress that may develop between two connected metals having different properties of thermal expansion, it is preferred that the bus bar material selected have an approximately equal or at least a similar coefficient of thermal expansion (CTE) as the CTE of the lead material of each LED lamp. Selecting a bus bar material having the same CTE as that of the LED lamp leads eliminates the possibility of a thermally related mechanical failure that may occur at the anode lead connection 34 and the cathode lead connection 36, and thus increases the reliability of the LED module. It is also desirable that the material selected for the bus bars be compatible with the material of the leads of the LED lamps to prevent the occurrence of undesirable galvanic action, such as corrosion or the like, at the points of connection.

FIG. 7 shows a third embodiment of the LED module 10 according to the present invention. The third embodiment is similar to the second embodiment in all respects except for the anode lead connection 34 and the cathode lead connection 36. Like the second embodiment, the anode bus bar and the cathode bus bar in the third embodiment are non-integral with the anode lead and cathode lead of each LED lamp. The leads of each LED lamp are mechanically and electrically connected to the bus bars by an interference fit formed between the leads and a tab 40 integral with the respective bus bars.

The lead connection is formed by first cutting at least one tab slot 38 into each bus bar to form a integral tab 40 as shown in FIGS. 7 and 8. During the cutting step the integral tab of each bus bar is bent outward and away from a front face of each bus bar as shown in FIGS. 8 and 9. The tab is of sufficient size and length to accommodate its placement over the surface of the complementary lead of each LED lamp. A connecting portion of the lead 24 of each LED lamp comprises a front face and a back face opposite to the front face. The back face of the connecting portion of each lead is placed into position against the front face of the respective bus bar near the attached portion of the integral tab. The integral tab is bent inward towards the bus bar around and over the lead as shown in FIGS. 7 and 10. A force is applied to the tab to form an interference fit by an intimate interface between the front face of the bar and the back face of the lead and between the front face of the lead and the integral tab.

Alternatively, the leads of each LED lamp may be connected to the respective bus bars by an interference fit comprising more than one integral tab 40. For example, a pair of integral tabs may be formed at each bus bar and bent around a lead to form an interference fit as shown in FIG. 11. Other connections such as the crimp connections used in solderless wire terminations and connectors could also be used, as well as interface "slots" common to insulation displacement connection schemes.

Like the second embodiment of the LED module, the third embodiment permits the arbitrary placement of the LED lamps along the pair of bus bars, thereby allowing the designer to place the LED lamps according to the particular lighting requirement or the particular configuration of the light assembly. It should also be noted that the position of the bus bars with respect to the LED lamps may be different from that illustrated in FIG. 7. For example, each bus bar 28 and 30 may be positioned with its face perpendicular to the back face of each LED lamp, similar to that illustrated in FIG. 2.

In each of these embodiments the conductive bus bars form the structural support for the LED lamps as well as the electrical connection. It is no longer necessary to employ a costly printed circuit board on which LED lamps are individually soldered.

Although limited embodiments of LED module have been described herein, many modifications and variations will be apparent to those skilled in the art. For example, it is to be understood within the scope of this invention that the LED lamps of the LED module may be attached to the bus bars by using a connection scheme other than that specifically described or illustrated. An alternative connection scheme may include a low heat interconnect technique that will not result in thermal damage to the LED lamp such as spot welding or the like.

Figure 12:
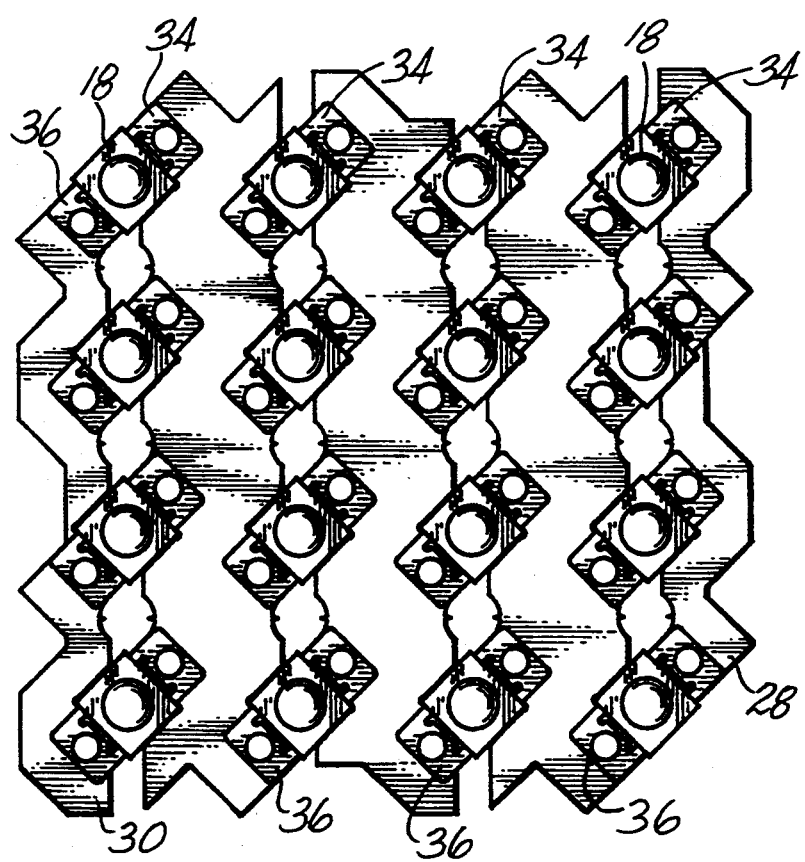
FIG. 12 is a plan view of an alternative embodiment of interconnected LED modules comprising a matrix of LED lamps.

It is also to be understood within the scope of this invention that the LED module may be interconnected together with other LED modules differently than that previously described or illustrated. For example, a number of LED modules may be interconnected together as shown in FIG. 12, resulting in a matrix arrangement of LED lamps. This interconnection arrangement between LED modules in this alternative embodiment is essentially the same as the series LED module interconnection represented in FIG. 4. However, instead of connecting together an end of a cathode bus bar with an end of an adjacent anode bus bar, the LED modules are electrically interconnected via a common bus bar which is relatively cathodic with respect to one parallel strip of LED lamps connected to it, and relatively anodic to a second parallel strip of LED lamps also connected to it. The matrix arrangement of LED lamps shown in FIG. 12 can be electrically connected to an external power source by connecting the cathodic portion of the power source to one bus bar at the end of the LED matrix, i.e., the bus bar residing at the far left of FIG. 12, and connecting the anode portion of the power source to the bus bar located at the other end of the LED matrix, i.e., at the far right side of FIG. 12. This particular configuration may be employed to achieve a predetermined lighting requirement or to facilitate placement within a particularly designed lighting assembly. The anode and cathode leads of each LED lamp may be mechanically and electrically connected to a bus bar by the mechanical connection scheme previously described in the second preferred embodiment above. Alternatively, it is to be understood that the LED lamps in this alternative embodiment may be connected to the bus bars by any other of the connection schemes previously described above.

Figure 13:
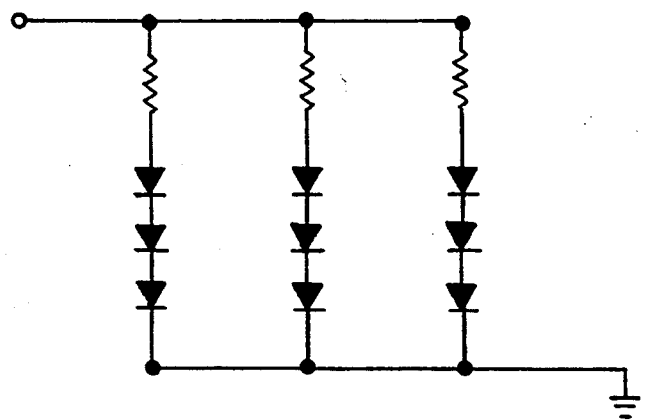
FIG. 13 is an electrical diagram of a alternative embodiment of the LED module comprising LED lamps arranged in series/parallel electrical connection.

It is to be understood within the scope of this invention that the LED module may be configured comprising a number of LED lamps arranged in parallel/series connection within the LED module. As shown in the electrical diagram illustrated in FIG. 13, such an alternative embodiment may comprise a number of serially connected LED lamp strings extending in parallel fashion between the anode and cathode bus bar. The LED lamps in this alternative embodiment may be connected by any of the connection schemes previously described above.

Accordingly, it is to be understood that, within the scope of the appended claims, the LED module according to the practice of this invention may be embodied other than that specifically described herein.

What is claimed is:

1. An LED module comprising:
    a plurality of LED lamps, each LED lamp having at least two connecting leads;
    an anode bus bar;
    a cathode bus bar; and
    means for mechanically and electrically connecting the LED lamps between the anode bus bar and cathode bus bar by a mechanical interlocking connection between a deformed portion of each LED lamp lead and an approximately complementary deformed portion of the bus bar, the deformed portions of the LED lamp lead and the bus bar forming button locks.

2. The LED module as recited in claim 1 wherein the plurality LED lamps are serially connected together between the anode and cathode bus bar to form a number of LED lamp strings that are each electrically connected in parallel with the anode bus bar and the cathode bus bar.

3. The LED module as recited in claim 2 wherein the leads of each LED lamp and the bus bars are made from electrically conductive materials having approximately equal coefficients of thermal expansion.

4. An LED module comprising:
    an anode bus bar;
    a cathode bus bar;
    a plurality of LED lamps disposed between the anode and cathode bus bars, each LED lamp having an anode lead and a cathode lead, the LED leads and the bus bars being constructed from electrically conductive materials having approximately equal coefficients of thermal expansion;
    solderless connection means for both electrically and mechanically connecting the LED lamps to the anode and cathode leads, the solderless connection means comprising a button lock; and
    means for interconnecting the LED module to a similarly constructed LED module in electrical series.

5. The LED module as recited in claim 4 wherein the plurality of LED lamps are serially connected together between the anode and cathode bus bar to form a number of LED lamp strings that are each electrically connected in parallel with the anode bus bar and the cathode bus bar.

* * * * *